(12) United States Patent
Siess et al.

(10) Patent No.: US 11,592,334 B2
(45) Date of Patent: Feb. 28, 2023

(54) PHOTOSENSORS FOR COLOR MEASUREMENT

(71) Applicant: ams Sensors Germany GmbH, Jena (DE)

(72) Inventors: Gunter Siess, Kraftsdorf (DE); Julius Komma, Jena (DE)

(73) Assignee: ams Sensors Germany GmbH, Jena (DE)

( * ) Notice: Subject to any disclaimer, the term of this patent is extended or adjusted under 35 U.S.C. 154(b) by 0 days.

(21) Appl. No.: 17/287,472

(22) PCT Filed: Nov. 4, 2019

(86) PCT No.: PCT/EP2019/080137
§ 371 (c)(1),
(2) Date: Apr. 21, 2021

(87) PCT Pub. No.: WO2020/094587
PCT Pub. Date: May 14, 2020

(65) Prior Publication Data
US 2021/0389181 A1 Dec. 16, 2021

Related U.S. Application Data

(60) Provisional application No. 62/755,824, filed on Nov. 5, 2018.

(51) Int. Cl.
*G01J 3/51* (2006.01)
*G01J 3/50* (2006.01)
(Continued)

(52) U.S. Cl.
CPC ............ *G01J 3/501* (2013.01); *G01J 1/4204* (2013.01); *G01J 3/0297* (2013.01); *G01J 3/51* (2013.01);
(Continued)

(58) Field of Classification Search
CPC .. G01J 1/4204; G01J 1/51; G01J 3/513; G01J 3/501
See application file for complete search history.

(56) References Cited

U.S. PATENT DOCUMENTS

| | | | | |
|---|---|---|---|---|
| 7,560,679 B1 * | 7/2009 | Gutierrez | ............. | H04N 13/207 250/226 |
| 2002/0084432 A1 * | 7/2002 | Sugiyama | ............. | G01S 7/4813 250/559.38 |

(Continued)

FOREIGN PATENT DOCUMENTS

| | | | | |
|---|---|---|---|---|
| DE | 102014014501 A1 * | 3/2016 | ........... | G08B 17/125 |
| JP | 2006033493 A * | 2/2006 | | |

(Continued)

OTHER PUBLICATIONS

Gannon Burgett, "Huawei P8 smartphone features 'world's first' four-color RGBW sensor, industry-leading OIS system" Apr. 15, 2015 (Year: 2015).*

(Continued)

*Primary Examiner* — Maurice C Smith
(74) *Attorney, Agent, or Firm* — Michael Best & Friedrich LLP (57) ABSTRACT

A sensor package includes a semiconductor sensor chip having multiple light sensitive regions each of which defines a respective light sensitive channel. An optical filter structure is disposed over the sensor chip and includes filters defining respective spectral functions for different ones of the light sensitive channels. In particular, the optical filter structure includes at least three optical filters defining spectral functions for tristimulus detection by a first subset of the light sensitive channels, and at least one additional optical filter defining a spectral function for spectral detection by a second subset of the light sensitive channels encompassing a wavelength range that differs from that of the first subset of light sensitive channels.

15 Claims, 6 Drawing Sheets

(51) Int. Cl.
  *G01J 1/42* (2006.01)
  *G01J 3/02* (2006.01)
  *G01J 3/46* (2006.01)
  *H01L 31/0216* (2014.01)
  *H04N 5/235* (2006.01)

(52) U.S. Cl.
  CPC ... *G01J 2003/467* (2013.01); *H01L 31/02162* (2013.01); *H04N 5/2353* (2013.01)

(56) References Cited

U.S. PATENT DOCUMENTS

2008/0252738 A1* 10/2008 Abe ............... H04N 9/04557
  348/222.1
2014/0176760 A1* 6/2014 Taguchi ............... H04N 5/3572
  348/224.1
2016/0131524 A1 5/2016 Arenhold et al.

FOREIGN PATENT DOCUMENTS

KR       20150003687 A  *  1/2015
WO    WO-2010018498 A1  *  2/2010  ............... G01J 1/32

OTHER PUBLICATIONS

International Search Report and Written Opinion for Application No. PCT/EP2019/080137 dated Apr. 14, 2020 (16 pages).
International Preliminary Report on Patentability for Application No. PCT/EP2019/080137 dated May 11, 2021 (8 pages).
Erb et al., "A Method for Improving the Accuracy of Tristimulus Colorimeters", Color Research & Application, vol. 9, No. 2, 1984, pp. 84-88.

* cited by examiner

PHOTOSENSORS FOR COLOR MEASUREMENT

FIELD OF THE DISCLOSURE

This disclosure relates to photosensors for color measurement.

BACKGROUND

Various applications for industrial products and consumer products employ color measurement. Several different techniques for color measurement are known, including comparison methods, spectral methods and tristimulus (or three-range) methods.

For applications where the perception of an observer is relevant, it often makes sense to express color differences in a color space adjusted to the biological principles of human color perception. The human eye with normal vision has three kinds of cone cells that sense light, having peaks of spectral sensitivity in short ("S," 420 nm-440 nm), middle ("M," 530 nm-540 nm), and long ("L," 560 nm-580 nm) wavelengths. Three parameters corresponding to levels of stimulus of the three kinds of cone cells can, in principle, describe any human color sensation. Weighting a total light power spectrum by the individual spectral sensitivities of the three kinds of cone cells renders three effective values of stimulus, which provide a tristimulus specification of the objective color of the light spectrum. The tristimulus values associated with a color space can be conceptualized as amounts of three primary colors in a tri-chromatic, additive color model. For example, the XYZ color space, created by the International Commission on Illumination ("CIE"), encompasses all color sensations that are visible to a person with average eyesight and defines a device-invariant representation of color that serves as a standard reference against which other color spaces are defined. The CIE 1931 color space, for example, defines the resulting tristimulus values that are denoted by "X," "Y" and "Z." A subsequently developed standard field-of-view is the CIE 10° Standard Observer, which provides a highly accurate degree of observation for matching human visual perception. The CIE tristimulus values (XYZ) can be calculated from the CIE Standard Observer functions.

An XYZ sensor can be used, for example, for direct color measurement (e.g., of light sources and/or ambient light) and provide the coordinates of the XYZ color space, which can be converted into other color spaces or into correlated color temperature ("CCT"). A measurement system that relies on XYZ sensors is independent of the spectral mixture of the detecting light and identifies only the standard spectral parts (i.e., the tristimulus values X, Y and Z). Thus, detailed spectral characteristics are not available using an XYZ sensor.

Spectral sensors, on the other hand, can facilitate a reconstruction of the measured light spectra as well as the calculation of color coordinates based on the estimated spectral result. A spectral reflectance sensor, for example, can provide information about the composition of a sample on the assumption that light not reflected from the sample is absorbed due to its composition.

SUMMARY

The present disclosure describes a photosensor for color measurement that has multiple optical detection channels in a single monolithic semiconductor chip so as to provide a sensor that is operable for both tristimulus (e.g., XYZ) detection and spectral reconstruction.

For example, in one aspect, the present disclosure describes a sensor package that includes a semiconductor sensor chip having multiple light sensitive regions each of which defines a respective light sensitive channel. An optical filter structure is disposed over the sensor chip and includes filters defining respective spectral functions for different ones of the light sensitive channels. In particular, the optical filter structure includes at least three optical filters defining spectral functions for tristimulus detection by a first subset of the light sensitive channels, and at least one additional optical filter defining a spectral function for spectral detection by a second subset of the light sensitive channels encompassing a wavelength range that differs from that of the first subset of light sensitive channels.

Some implementations include one or more of the following features. For example, in some instances, the at least three optical filters can correspond to respective coordinates of a CIE color space. In some cases, the at least three optical filters correspond to respective components of the XYZ color space. For example, the at least three optical filters can include a first optical filter that defines a first spectral function corresponding to the X coordinate of the XYZ color space, the first optical filter being disposed over a first one of the channels; a second optical filter that defines a second spectral function corresponding to the Y coordinate of the XYZ color space, the second optical filter being disposed over a second one of the channels; and a third optical filter that defines a third spectral function corresponding to the Z coordinate of the XYZ color space, the third optical filter being disposed over a third one of the channels. In some implementations, the at least three optical filters include a first optical filter that defines a first spectral function corresponding to a first part of the X coordinate of the XYZ color space, the first optical filter being disposed over a first one of the channels; a second optical filter that defines a second spectral function corresponding to a second part of the X coordinate of the XYZ color space, the second optical filter being disposed over a second one of the channels; a third optical filter that defines a third spectral function corresponding to the Y coordinate of the XYZ color space, the third optical filter being disposed over a third one of the channels; and a fourth optical filter that defines a fourth spectral function corresponding to the Z coordinate of the XYZ color space, the fourth optical filter being disposed over a fourth one of the channels.

In some instances, the at least three optical filters and the at least one additional optical filter define respective spectral functions that, collectively, cover a majority of the visible range of the electromagnetic spectrum. In some implementations, the at least one additional optical filter includes a filter than defines a spectral function in an infrared range of the electromagnetic spectrum or a spectral function in an ultra-violet range of the electromagnetic spectrum.

The optical filter structure can include interference filters that define respective transmission functions for the channels. In some cases, the at least one additional optical filter includes five filters each of which defines a respective spectral function having a respective peak and each of which is disposed over a respective one of the channels in the second subset. The sensor package may include a window through which radiation from outside the package can pass to the sensor chip.

The present disclosure also describes an apparatus that includes a sensor package and processing circuitry operable to receive and process signals from the light sensitive channels. In some instances, the processing circuitry is operable to use output signals from the first subset of channels of the sensor chip to determine an ambient light level. The processing circuitry also can be operable to use output signals from the second subset of channels of the sensor chip for spectral reconstruction.

In some implementations, the sensor package in integrated into a host device, such as a smartphone or other computing device. In some cases, the host device includes a display screen, wherein the processing circuitry is operable to adjust a brightness of the display screen based on the ambient light level. In some cases, the host device includes a camera, wherein the processing circuitry is operable to adjust a setting of the camera based on the ambient light level. The processing circuitry also can be operable to adjust a setting of the camera based on the spectral reconstruction.

The present disclosure further describes a method of calibrating a sensor package. The method includes calibrating the channels of the sensor chip using a matrix operation based on a linear combination of a best fit to a target function taking into account filter tolerances of the channels for tristimulus detection and the channels for spectral detection. In some instances, a wide band pass filter is provided over the channels for tristimulus detection and the channels for spectral detection.

Using the same sensor for both tristimulus detection and spectral reconstruction can be advantageous, for example, in mobile applications (e.g., smartphones or other personal computing devices) where space is at a premium. Further, using the same sensor for both tristimulus detection and spectral reconstruction can help reduce overall costs associated with the smartphone or other host device. In some implementations, the sensor is operable both as an ambient light sensor and as a sensor for spectral reconstruction (e.g., based on light reflected from a target).

Other aspects, features and advantages will be readily apparent form the following detailed description, the accompanying drawings and the claims.

DETAILED DESCRIPTION

Figure 1:
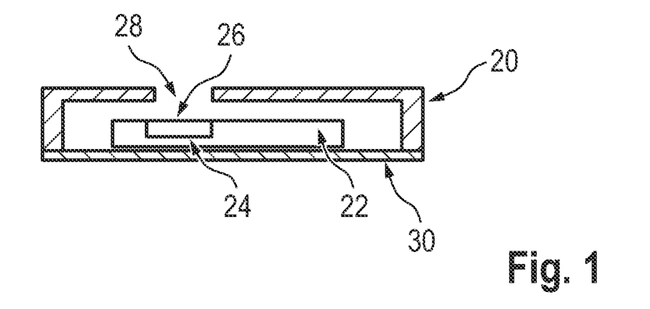
FIG. 1 illustrates an example of a sensor package.
Figure 2:
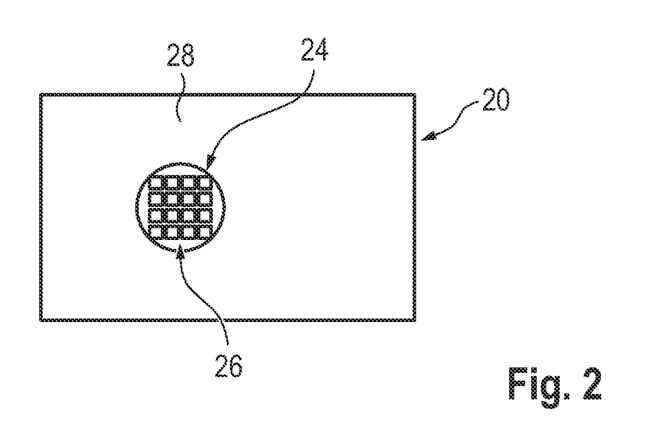
FIG. 2 illustrates a top view of the sensor package of FIG. 1.

As shown in FIGS. 1 and 2, a sensor package 20 includes a monolithic sensor chip 22 (e.g., a silicon or other semiconductor chip) defining a region 24 containing multiple light sensitive channels. The light sensitive channels can be implemented, for example, in CMOS or CCD technologies to provide multiple pixels, where each pixel corresponds to a respective channel. In some instances, each light sensitive channel is implemented as a respective P-I-N diode or other semiconductor-based light detector. The light sensitive channels can be arranged, for example, as a M×N array (with each of M and N≥2), as a linear M×1 array, in a circle, or in some other arrangement. The sensor chip 22 can be contained in a housing having an aperture or other window 28 through which radiation from outside the package 20 can pass, so as to be detected by the sensor chip 22. In some instances, the sensor can be implemented in a chip size package where radiation enters through an optical window of a host device (e.g., a smartphone).

Figure 3:
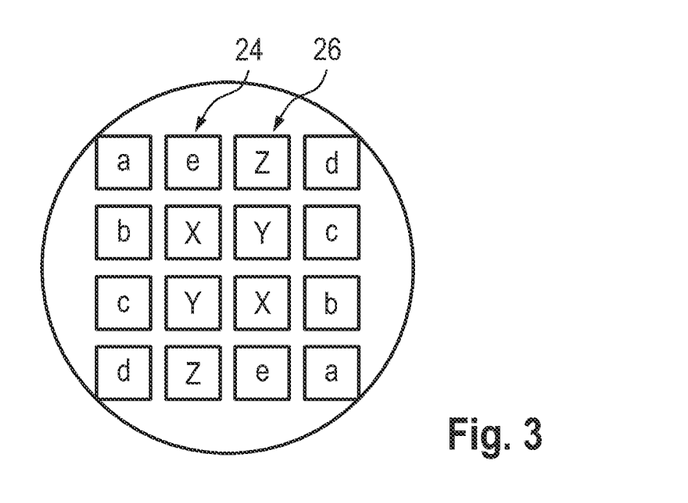
FIG. 3 is an example of an optical filter structure.
Figure 4:
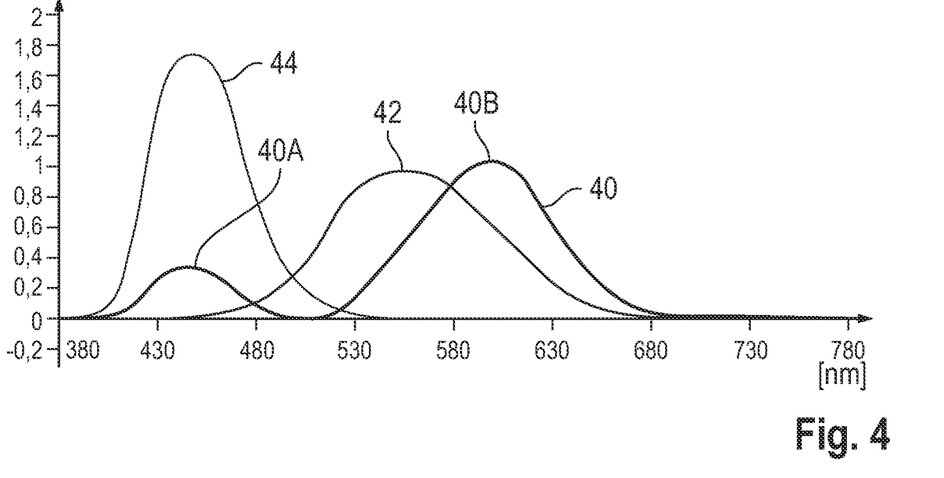
FIG. 4 illustrates an example of standard normalized spectral functions for the coordinates of a CIE color space.

An optical filter structure 26 is disposed over the light sensitive region 24 such that different parts of the light sensitive region 24 have different respective spectral sensitivities. The optical filter structure 26 includes different filters for the various optical channels in the light sensitive region 24. An example is illustrated in FIG. 3, which shows a 4×4 array (i.e., a total of sixteen channels) having respective optical filters (i.e., X, Y, Z, a, b, c, d and e). The filter structure 26 is configured such that at least three of the optical channels have spectral transmissions adapted to the normal spectral functions of the human eye. FIG. 4 illustrates an example of the standard normalized spectral functions 40, 42, 44 of the filters X, Y and Z for the respective coordinates of a CIE color space. Thus, at least three of the filters facilitate tristimulus (e.g., XYZ) detection. In some implementations, the CIE 10° Standard Observer definitions may be used; in other implementations, the CIE 2° Standard Observer definitions may be used. In general, the sensor sensitivity function is the spectral product of the spectral sensitivity of the semiconductor (e.g., silicon) detector and the spectral transmission function of the particular optical filter. A suitable filter transmission for each filter thus can be calculated and designed based on the target sensitivity and the semiconductor detector sensitivity for each channel.

Figure 5:
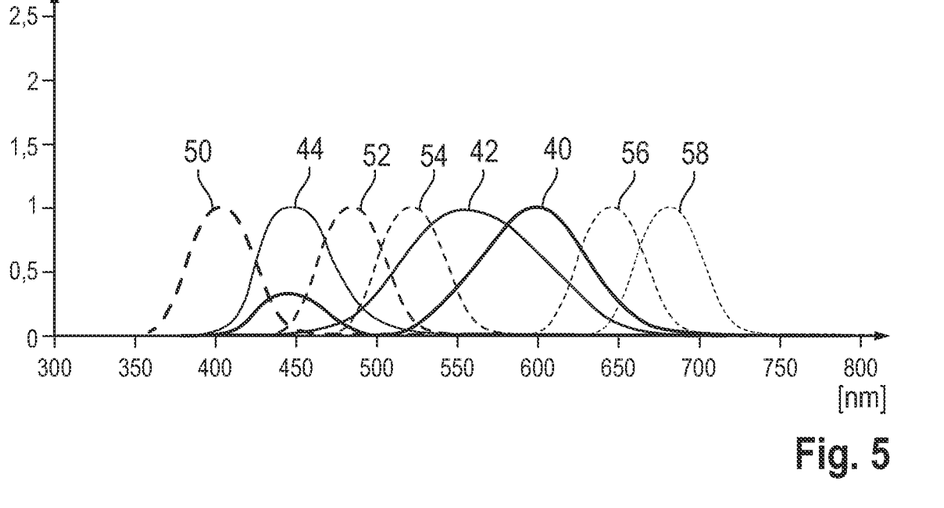
FIG. 5 illustrates examples of sensitivity functions for additional spectral channels.

In addition to the optical filters for the tristimulus detection channels, the filter structure 26 includes one or more additional filters (labeled a, b, c, d, e in FIG. 3) over respective parts of the light sensitive region 24 to define one or more spectral channels. Preferably, the additional filters (a, b, c, d, e) are chosen such that the spectral channels have sensitivity functions that encompass portions of the visible spectrum different from those covered by the channels for tristimulus detection, although they may overlap those channels partially in some instances. FIG. 5 illustrates examples of sensitivity functions 50, 52, 54, 56, 58 for the spectral channels a, b, c, d, e. Each of the spectral functions 50, 52, 54, 56, 58 has a respective peak, and collectively, the spectral functions 40, 42, 44, 50, 52, 54, 56, 58 can cover most, or all, of the visible spectrum (i.e., 380 nm-780 nm).

The optical filter structure 26 can be implemented, for example, using interference filters to define the respective transmission function for each channel. Such filters can provide flexibility and, thus, a good fit for the spectral functions 40, 42, 44 of the tristimulus detection channels. In some cases, other types of filters can be used (e.g., absorption filters; plasmonic filters; Fabry-Perot filters), or combinations of different types of filters.

In the example of FIG. 3, the filter structure 26 is configured such that the sensor has multiple (e.g., two) channels for each spectral function 40, 42, 44, 50, 52, 54, 56, 58. Such an arrangement can provide greater robustness.

Figure 6:
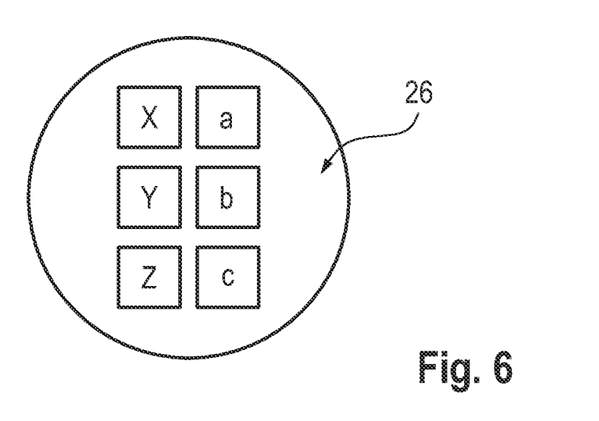
FIG. 6 shows an example of an optical filter structure using a 2×3 array.

Other arrangements may include only a single channel for each of the spectral functions, or may be arranged so that there are multiple channels corresponding to some of the spectral functions and only a single channel corresponding to other ones of the spectral functions. Further, the total number of channels, and thus the corresponding number of filters, may differ from the example of FIG. 3. Thus, as shown in FIG. 6, some implementations include an optical filter structure 26 may use for a 2×3 array of channels, including three channels for tristimulus detection (X, Y, Z) and three additional channels for spectral detection (a, b, c).

Figure 7:
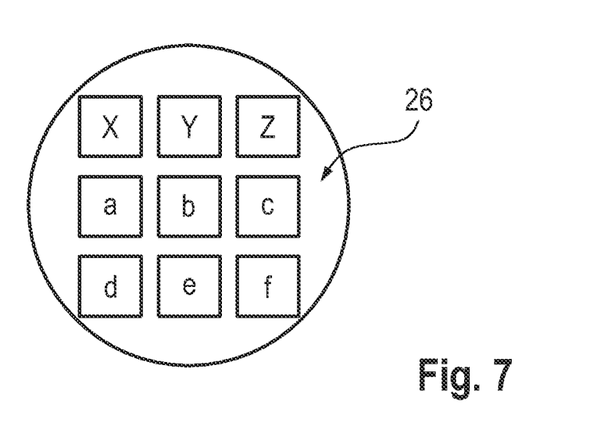
FIG. 7 shows an example of an optical filter structure using a 3×3 array.

Likewise, FIG. 7 illustrates an optical filter structure 26 for a 3×3 array of channels, including three channels for tristimulus detection (X, Y, Z) and six additional channels for spectral detection (a, b, c, d, e, f). Other configurations are possible as well. In each implementation, the additional filters for the spectral detection channels can be chosen so as to have sensitivity functions that encompass portions of the visible spectrum different from those covered by the channels for tristimulus detection, although, as mentioned above, they may overlap those channels partially in some instances. Further, the relative positions of the various channels (and the corresponding filters) for tristimulus and spectral detection can differ from the illustrated examples.

Figure 8:
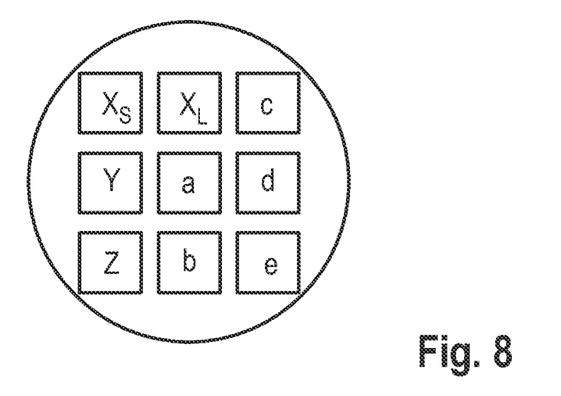
FIG. 8 shows another example of an optical filter structure.

As is apparent from FIG. 4, the spectral function 40 corresponding to the X coordinate of the tristimulus detection covers two different ranges of wavelengths having different respective peaks 40A, 40B. In some implementations, it can be beneficial to separate detection for the X coordinate into two different channels, one corresponding to that part of the spectral function 40 that encompasses the shorter peak 40A and one for that part of the spectral function 40 that encompasses the longer peak 40B. In such cases, as shown in FIG. 8, the filter structure 26 can include four different filters for the tristimulus detection channels: $X_S$, $X_L$, Y and Z, where $X_S$ and $X_L$ represent, respectively, the filters for the shorter and longer wavelength parts of the spectral function 40. In some instances, better performance can be obtained using such a filter structure.

Figure 9:
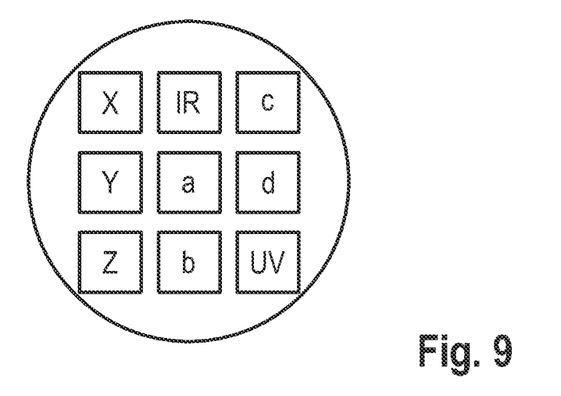
FIG. 9 shows a further example of an optical filter structure.

In some implementations, one or more of the additional channels for spectral detection can be configured to detect wavelengths of light outside the visible range, such as infrared (IR) and/or ultra-violet (UV). In such cases, as illustrated in FIG. 9, the filter structure 26 can include filters corresponding to the spectral functions for the IR and UV channels. In some instances, additional optical structures such as micro lenses or micro apertures are mounted directly to the sensor chip.

Figure 10:
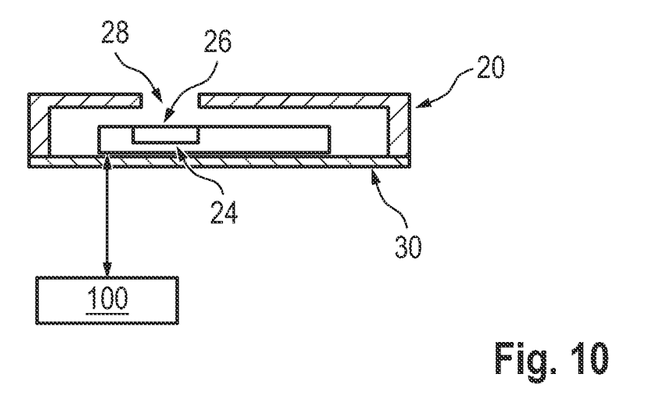
FIG. 10 illustrates an example of the sensor chip coupled to processing circuitry.

As shown in FIG. 10, the sensor chip 22 can be coupled to processing circuitry 100 operable to read and process signals from the sensor channels based on the light detected by each respective channel. The processing circuitry 100 can be implemented, for example, as one or more integrated circuits in one or more semiconductor chips with appropriate digital logic and/or other hardware components (e.g., read-out registers; amplifiers; analog-to-digital converters; clock drivers; timing logic; signal processing circuitry; and/or microprocessor). The processing circuitry also may be implemented in or contain software (e.g., machine-readable instructions stored in memory). The circuitry 100 is operable to process the received signals in accordance with specified programs. The processing circuitry 100 may be included within the package 20 or may be external to the package. In the latter case, the processing circuitry 100 may be, for example, part of a host device into which the sensor package 20 is integrated.

Figure 11:
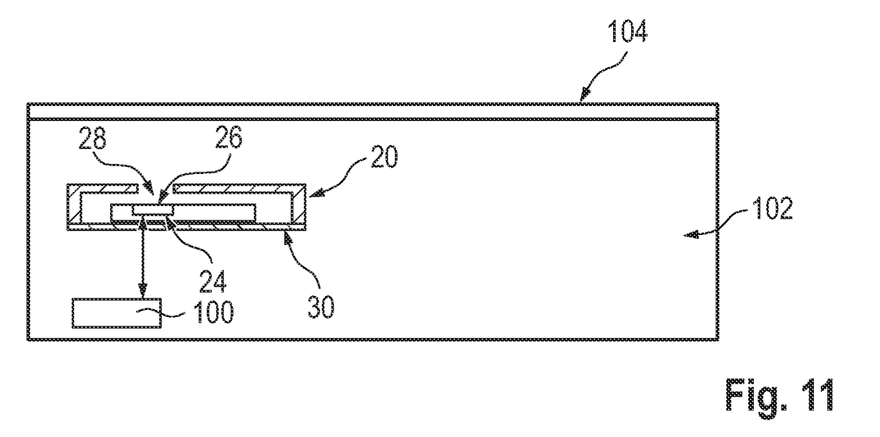
FIG. 11 shows an example of the sensor chip integrated into a host device.

The sensor package 20 can be used in a wide range of applications. For example, as shown in FIG. 11, the sensor package 20 can be integrated into a host device 102 such as a portable computing device (e.g., a smartphone, personal digital assistant (PDA), laptop or wearable computing device, any of which may be connectable to the Internet). The tristimulus detection channels of the sensor package 20 can be used, for example, as an ambient light sensor in a smartphone, and the output of the tristimulus detection channels can used to adjust the brightness of the smartphone or other host's display screen 104. By providing the additional spectral channels in the same sensor chip 22, the sensor also can be used in other applications such as color measurements with spectral reconstruction or remission (i.e., applications where light reflected from a target is detected and a determination or further action is taken depending on an analysis of the detected light). In such instances, the host device 102 also can include an illumination source to illuminate the target with light having predetermined characteristics. Using the same sensor for both tristimulus detection and spectral reconstruction can be advantageous, for example, in mobile applications (e.g., smartphones or other personal computing devices) where space is at a premium. Further, using the same sensor for both tristimulus detection and spectral reconstruction can help reduce overall costs associated with the smartphone or other host device.

In some implementations, the host device 102 (e.g., smartphone) may include a camera for photography. The processor 100 can be configured to analyze the sensor output from the tristimulus channels to determine the ambient light level and to adjust one or more settings of the camera (e.g., exposure time) automatically in response to the determined ambient light level. In addition, the processor can be configured to analyze signals from the additional spectral channels to determine, for example, the nature of the light source generating the ambient light (e.g., whether it is sunlight or an indoor LED lamp). In some instances, further adjustments may be made automatically to the camera settings in response to such a determination.

A further advantage of combining the tristimulus (e.g., XYZ) detection channels and the additional spectral reconstruction channels in the same sensor relates to the potential for improved calibration, and thus better accuracy, for the tristimulus detection channels, as explained in the following paragraphs.

Figure 12:
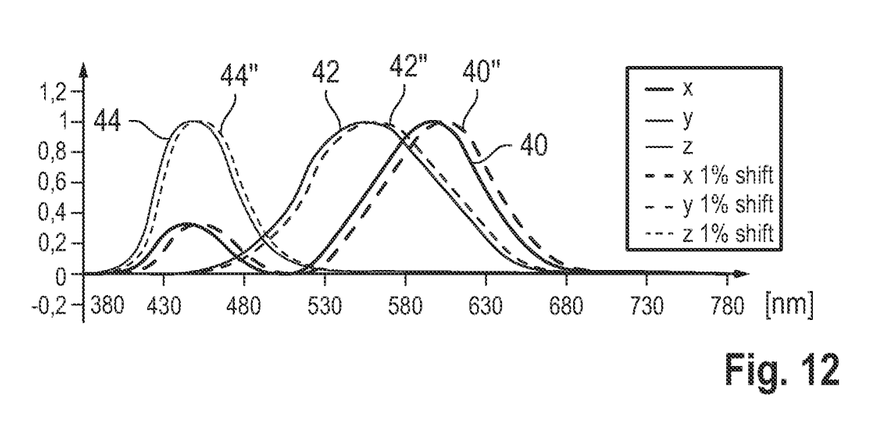
FIG. 12 illustrates an example in which the sensitivity functions for the tristimulus channel shows spectral shifts.

Deviations from design (e.g., shape and stop band performance), filter production (e.g., spectral shift) and optical characteristics (e.g., spectral shift caused by field-of-view (FOV)) can result in deviations from the target spectral sensitivity function (e.g., CIE). Thus, for example, imperfect tool production can lead to significant spectral shifts in the interference filters relative to the desired XYZ sensitivity functions. FIG. 12 illustrates an example in which the X, Y, Z interference filters have respective sensitivity functions 40", 42", 44" that result in about a 1% spectral shift from the ideal sensitivity functions 40, 42, 44. The spectral mismatches can be significant even using known calibration techniques. Nevertheless, calibration of the XYZ tristimulus channels can be improved by taking into account the additional spectral detection channels and generating a calibration matrix. For example, if there are total of eight detection channels (i.e., three tristimulus and five spectral detection channels), the following calibration matrix, M, can be generated and used to calibrate the tristimulus detection channels based on a best fit approach. The use of $XYZ_{Sensor}$ and five additional channels ($XYZ+5_{Sensor}$) in the direct calibration to $XYZ_{CIE}$ employs conversion of an eight channel sensor into three values of $XYZ_{CIE}$. In this case, the calibration matrix, M, has dimensions of 3×8:

$$M=(XYZ_{CIE}*XYZ+5_{Sensor}{}^T)*(XYZ+5_{Sensor}*XYZ+5_{Sensor}{}^T)^{-1}$$

$$(XYZ_{CIE})^T=M_{(3\times3)}*(XYZ+5_{Sensor})^T$$

Using the foregoing techniques, spectral peaks in the complete spectral range can be detected with greater accuracy in color coordinates. Further, performance can be optimized, in some cases, by knowledge of the expected spectral variation in the production process and by adjustment of the spectra of the additional channels (e.g., counts, peak wavelength, full width half minimum (FWHM), and/or spectral shape)).

Figure 13:
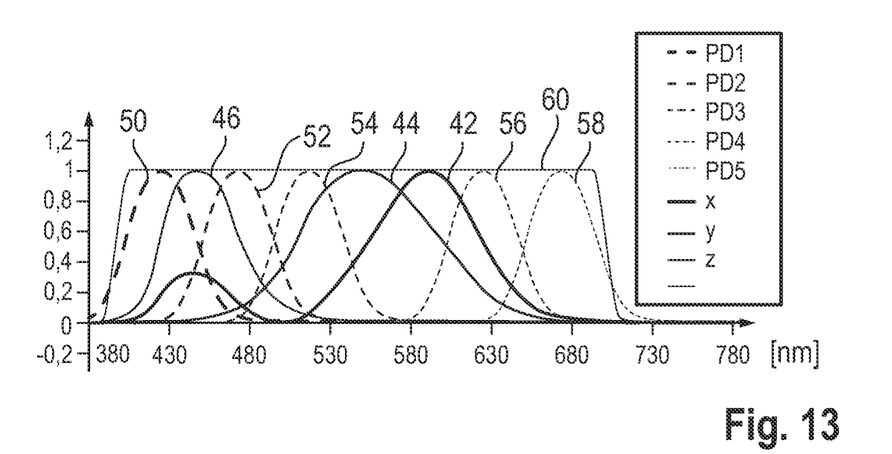
FIG. 13 illustrates an example of the spectral sensitivity curve for a wide band pass filter.

Thus, an optimum arrangement can be achieved by having the best fit options take into account the filter tolerances of all the sensor channels, not the channels for tristimulus detection. Computer simulations indicate that a significant improvement can be obtained in reducing the spectral deviations. Some deviations, however, may still be caused by the stop band performance outside of the main spectra of the channels (e.g., higher orders the desired range). Such deviations can be reduced by providing an additional wide band pass filter over both the XYZ tristimulus channels and the additional spectral channels. FIG. 13 illustrates an example of the spectral sensitivity curve 60 for the wide band pass filter.

In some instances, the same sensor configuration also can be used for spectral reconstruction, where each sensor channel is independent from the others. In such cases, the calibration matrix describes the transformation from the eight sensor signals into a number (n) of spectral nodes. For example, for the reconstruction of a target spectra of n spectral nodes in the visible range, the calibration matrix, M, has a dimension of n×8:

$$(\alpha_{\lambda_1}\alpha_{\lambda_1}\ldots\alpha_{\lambda_n})^T=M_{(n\times8)}*(XYZ+5_{Sensor})^T$$

Calculation of the matrix also can be performed by target calibration using a minimum of n sample spectra or by using knowledge of the spectral sensor sensitivities.

Various modifications will be readily apparent from the foregoing description. Thus, other implementations are within the scope of the claims.

The invention claimed is:

1. A sensor package comprising:
  a semiconductor sensor chip having multiple light sensitive regions each of which defines a respective light sensitive channel; and
  an optical filter structure disposed over the sensor chip, the optical filter structure including filters defining respective spectral functions for different ones of the light sensitive channels, wherein the optical filter structure includes:
    at least three optical filters defining spectral functions for tristimulus detection by a first subset of the light sensitive channels; and
    at least one additional optical filter defining a spectral function for spectral detection by a second subset of the light sensitive channels encompassing a wavelength range that differs from that of the first subset of light sensitive channels,
  wherein the at least three optical filters correspond to respective coordinates of a CIE color space,
  wherein the at least three optical filters correspond to respective components of the XYZ color space; and
  wherein the at least three optical filters includes:
    a first optical filter that defines a first spectral function corresponding to a first part of the X coordinate of the XYZ color space, the first optical filter being disposed over a first one of the channels;
    a second optical filter that defines a second spectral function corresponding to a second part of the X coordinate of the XYZ color space, the second optical filter being disposed over a second one of the channels;
    a third optical filter that defines a third spectral function corresponding to the Y coordinate of the XYZ color space, the third optical filter being disposed over a third one of the channels; and
    a fourth optical filter that defines a fourth spectral function corresponding to the Z coordinate of the XYZ color space, the fourth optical filter being disposed over a fourth one of the channels.

2. The sensor package of claim 1 wherein the at least three optical filters and the at least one additional optical filter define respective spectral functions that, collectively, cover a majority of the visible range of the electromagnetic spectrum.

3. The sensor package of claim 1 wherein the at least one additional optical filter includes a filter that defines a spectral function in an infra-red range of the electromagnetic spectrum.

4. The sensor package of claim 1 wherein the at least one additional optical filter includes a filter that defines a spectral function in an ultra-violet range of the electromagnetic spectrum.

5. The sensor package of claim 1 wherein the optical filter structure comprises interference filters that define respective transmission functions for the channels.

6. The sensor package of claim 1 wherein the at least one additional optical filter includes five filters each of which defines a respective spectral function having a respective peak and each of which is disposed over a respective one of the channels in the second subset.

7. The sensor package of claim 1 further including a window through which radiation from outside the package can pass to the sensor chip.

8. An apparatus comprising:
  a sensor package according to claim 1; and
  processing circuitry operable to receive and process signals from the light sensitive channels, wherein the processing circuitry is operable to use output signals from the first subset of channels of the sensor chip to determine an ambient light level.

9. The apparatus of claim 8 wherein the processing circuitry is operable to use output signals from the second subset of channels of the sensor chip for spectral reconstruction.

10. A host device comprising:
  a sensor package according to claim 1; and
  processing circuitry operable to receive and process signals from the light sensitive channels;
  wherein the processing circuitry is operable to use output signals from the first subset of channels of the sensor chip to determine an ambient light level; and
  wherein the processing circuitry is operable to use output signals from the second subset of channels of the sensor chip for spectral reconstruction.

11. The host device of claim 10 wherein the host device is a smartphone.

12. The host device of claim 10 further including a display screen, wherein the processing circuitry is operable to adjust a brightness of the display screen based on the ambient light level.

13. The host device of claim 10 further including a camera, wherein the processing circuitry is operable to adjust a setting of the camera based on the ambient light level.

14. The host device of claim 13 wherein the processing circuitry further is operable to adjust a setting of the camera based on the spectral reconstruction.

15. A method of calibrating the sensor package of claim 1, the method comprising:
- calibrating the channels of the sensor chip using a matrix operation based on a linear combination of a best fit to a target function taking into account filter tolerances of the channels for tristimulus detection and the channels for spectral detection; and
- providing a wide band pass filter over the channels for tristimulus detection and the channels for spectral detection.

\* \* \* \* \*